(12) United States Patent
Tsugaru et al.

(10) Patent No.: US 8,152,950 B2
(45) Date of Patent: Apr. 10, 2012

(54) MULTI-LAYER CIRCUIT BOARD AND METHOD OF MAKING THE SAME

(75) Inventors: Toshinori Tsugaru, Osaka (JP); Tatsuya Sunamoto, Kurashiki (JP); Tadao Yoshikawa, Kurashiki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 0 days.

(21) Appl. No.: 12/342,377

(22) Filed: Dec. 23, 2008

(65) Prior Publication Data

US 2009/0107624 A1    Apr. 30, 2009

Related U.S. Application Data

(62) Division of application No. 10/639,648, filed on Aug. 13, 2003, now abandoned.

(30) Foreign Application Priority Data

Aug. 28, 2002 (JP) .................................. 2002-247974

(51) Int. Cl.
*B32B 37/04* (2006.01)

(52) U.S. Cl. .................. 156/272.2; 156/308.2; 156/320; 174/50; 174/254; 174/259

(58) Field of Classification Search ............... 156/308.2, 156/320
See application file for complete search history.

(56) References Cited

U.S. PATENT DOCUMENTS

| | | | |
|---|---|---|---|
| 3,244,795 A | 4/1966 | Latimer | |
| 4,384,016 A * | 5/1983 | Ide et al. | 428/480 |
| 5,259,110 A * | 11/1993 | Bross et al. | 29/830 |
| 5,719,354 A * | 2/1998 | Jester et al. | 174/255 |
| 6,243,946 B1 | 6/2001 | Suzuki et al. | |
| 6,334,922 B1 | 1/2002 | Tanaka et al. | |

(Continued)

FOREIGN PATENT DOCUMENTS

JP    11-309803    11/1999

(Continued)

OTHER PUBLICATIONS

Examination Report issued Feb. 17, 2011, in European Patent Application No. 03 018 683.7-1232.

*Primary Examiner* — Khanh P Nguyen
*Assistant Examiner* — Margaret Squalls
(74) *Attorney, Agent, or Firm* — Oblon, Spivak, McClelland, Maier & Neustadt, L.L.P.

(57) ABSTRACT

A method of making a multi-layer circuit board that has a first film and at least two more films, second and third films, each being made of a thermoplastic polymer capable of forming an optically anisotropic melt phase, the first film having a low melting point, the second and third films having respective melting points higher than the melting point of the first film and at least one of the second and the third films having a circuit pattern thereon, and the first to third films are thermo compressed together with the first film interposed between the second and third films. This method entails causing at least one of the circuit patterns on one of the second and third films to contact an opposing surface of the other of the second and third films through the first film during the thermo compression bonding of the first to third films.

9 Claims, 8 Drawing Sheets

| U.S. PATENT DOCUMENTS | | | FOREIGN PATENT DOCUMENTS | | |
|---|---|---|---|---|---|
| 6,524,892 B1 | 2/2003 | Kishimoto et al. | JP | 2000-183506 | 6/2000 |
| 6,602,583 B2 | 8/2003 | St. Lawrence et al. | JP | 2000-269626 | 9/2000 |
| 6,761,834 B2 | 7/2004 | St. Lawrence et al. | JP | 2001-144206 | 5/2001 |
| 6,889,433 B1 | 5/2005 | Enomoto et al. | | | |
| 6,931,723 B1 | 8/2005 | Powell | | | |

\* cited by examiner

MULTI-LAYER CIRCUIT BOARD AND METHOD OF MAKING THE SAME

RELATED APPLICATIONS

This application is a divisional of U.S. Ser. No. 10/639,648, filed on Aug. 13, 2003, which is based on Japanese Patent Application No. 2002-247974, filed on Aug. 28, 2002, the entire contents of which are hereby incorporated by reference.

BACKGROUND OF THE INVENTION

1. Field of the Invention

The present invention relates to a multi-layer circuit board utilizing, as an insulating layer, a film made of a thermoplastic polymer capable of forming an optically anisotropic melt phase and also relates to a method of making such multi-layer circuit board.

In the description of the present invention, the thermoplastic polymer capable of forming an optically anisotropic melt phase will be referred to as a "thermoplastic liquid crystal polymer" unless otherwise specified and, also, the film utilizing such thermoplastic liquid crystal polymer will be referred to as a "thermoplastic liquid crystal polymer film" unless otherwise specified.

2. Description of the Related Art

In order to realize a three-dimensional electric connection in a multi-layer circuit board, a printed wiring board, which constitutes the multi-layer circuit board, includes wiring (often referred to as a "surface wiring" or a "circuit pattern") formed on a surface of a printed wiring board, wiring (hereinafter referred to as an "intra-layer wiring") formed so as to extend internally of a printed wiring board, and wiring (hereinafter referred to as an "interlayer wiring") formed so as to extend completely across the thickness of some printed wiring boards.

The multi-layer circuit board generally makes use of sheets of materials having different chemical compositions and/or heat resistance properties such as melting points and is generally made by thermo compression bonding of one or more sheets having an intra-layer and/or a surface wiring and one or more sheets having no wiring formed therein. If the materials for the respective sheets forming the multi-layer circuit board have the same melting point, those sheets would melt simultaneously during the thermo compression bonding process. Therefore, the materials for the respective sheets must have melting points different from each other.

By way of example, the U.S. Pat. No. 5,719,354 and the Japanese Patent Application Laid-open No. Hei 11-309803 disclose a multi-layer circuit board comprising, as printed wiring boards, two films made of thermoplastic liquid crystal polymer and having surface wiring and intra-layer wiring, and, as a bonding layer, a thermoplastic liquid crystal polymer film interposed between the two films, wherein the bonding layer has a melting point lower than that of the two films. In this known multi-layer circuit board, the printed wiring boards are electrically insulated from each other by means of the bonding layer (See, for example, FIGS. 1D and 1E of the U.S. Pat. No. 5,719,354 and FIG. 1 of the Japanese Patent Application Laid-open No. Hei 11-309803). Specifically, the U.S. Pat. No. 5,719,354 describes, in column 5, lines 61 to 64 and column 6, lines 4 to 6 thereof, that drilling to form perforations through the bonding layer and a succeeding metal application are necessary in order to realize the electric connection between the printed wiring boards.

For the drilling discussed above, a drill or a laser have been conventionally employed, in which a drilling process of drilling predetermined sites to form respective holes is conducted. And for the metal application discussed above, one method (hereinafter referred to as a "plating method") has been conventionally employed, in which chemical and electric plating processes to form plated layers over the surfaces of the wall in the holes are conducted in succession. In addition, another method (hereinafter referred to as a "pasting method") can be employed for that purpose, in which an electroconductive paste is applied, or otherwise printed, to fill the hole formed by means of a laser or by the use of a drill and is subsequently cured.

It has, however, been found that the multi-layer circuit board that requires formation of holes extending through the printed wiring board and bonding layers has a problem in that neither formation of wiring nor mounting of electronic parts can be effected onto front and rear surface regions of the circuit board where holes for interlayer connection are formed. Accordingly, not only is this known multi-layer circuit board incapable of meeting with the recent demand for a high-density surface mounting of electronic parts, but the method of making the known multi-layer circuit board includes a series of manufacturing steps, some of which appear to be redundant enough to require a complicated process control.

SUMMARY OF THE INVENTION

Under the above-described circumstances, the present invention is accomplished. In one aspect of the present invention, a method of making a multi-layer circuit board is provided, wherein thermoplastic liquid crystal polymer films are thermo compressed together. The thermoplastic liquid crystal polymer films comprises a first film and at least two more films, second and third films, each being made of a thermoplastic polymer capable of forming an optically anisotropic melt phase. The first film has a low melting point, and the second and third films have respective melting point higher than the melting point of the first film. And at least one of the second and the third films have a circuit pattern thereon. The first to third films are thermo compressed together with the first film interposed between the second and third films. The method includes making at least one of the circuit patterns on one of the second and third films to be contacted with an opposing surface of the other of the second and third films through the first film during the thermo compression bonding of the first to third films.

Also, the present invention provides an improved multi-layer circuit board capable of achieving a high density surface mounting of electronic parts. Said multi-layer circuit board can be produced by simplified process of manufacture. The multi-layer circuit board of the present invention includes a first film and at least two more films, second and third films, each being made of a thermoplastic polymer capable of forming an optically anisotropic melt phase. The first film has a low melting point, and the second and third films have respective melting points higher than the melting point of the first film. The first to third films are thermo compressed together with the first film interposed between the second and third films. A circuit pattern is formed in one or both of the second and third films, and at least one of the circuit patterns on one of the second and third films contacts an opposing surface of the other of the second and third films through the first film.

According to the present invention, not only can any undesirable displacement in the circuit patterns formed respectively on the second and third films, which would result from the flow of a resin material for the first film, advantageously be suppressed, but a reliable electric connection can also be established between these circuit patterns. This multi-layer circuit board of the present invention holds excellent properties of the thermoplastic liquid crystal polymer such as a low water absorption and an excellent electric characteristics. In addition, the multi-layer circuit board of the present invention can satisfy the heat resistance required for circuit boards in general.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, the same reference numerals are used to specify the same parts throughout the several views, and:

FIGS. 1A and 1B illustrate the sequence of making a multi-layer circuit board according to a first preferred embodiment of the present invention, in which FIG. 1A is a vertical sectional view of the arrangement of the components which constitute the multi-layer circuit board prior to a thermo compression bonding and FIG. 1B is a vertical sectional view of the multi-layer circuit board after the thermo compression bonding;

FIGS. 2A and 2B illustrate the sequence of making the multi-layer circuit board according to a second preferred embodiment of the present invention, in which FIG. 2A is a vertical sectional view of the arrangement of the components which constitute the multi-layer circuit board prior to the thermo compression bonding and FIG. 2B is a vertical sectional view of the multi-layer circuit board after the thermo compression bonding;

FIGS. 3A and 3B illustrate the sequence of making the multi-layer circuit board according to a third preferred embodiment of the present invention, in which FIG. 3A is a vertical sectional view of the arrangement of the components which constitute the multi-layer circuit board prior to the thermo compression bonding and FIG. 3B is a vertical sectional view of the multi-layer circuit board after the thermo compression bonding;

DETAILED DESCRIPTION OF THE PREFERRED EMBODIMENTS

Figure 1A:
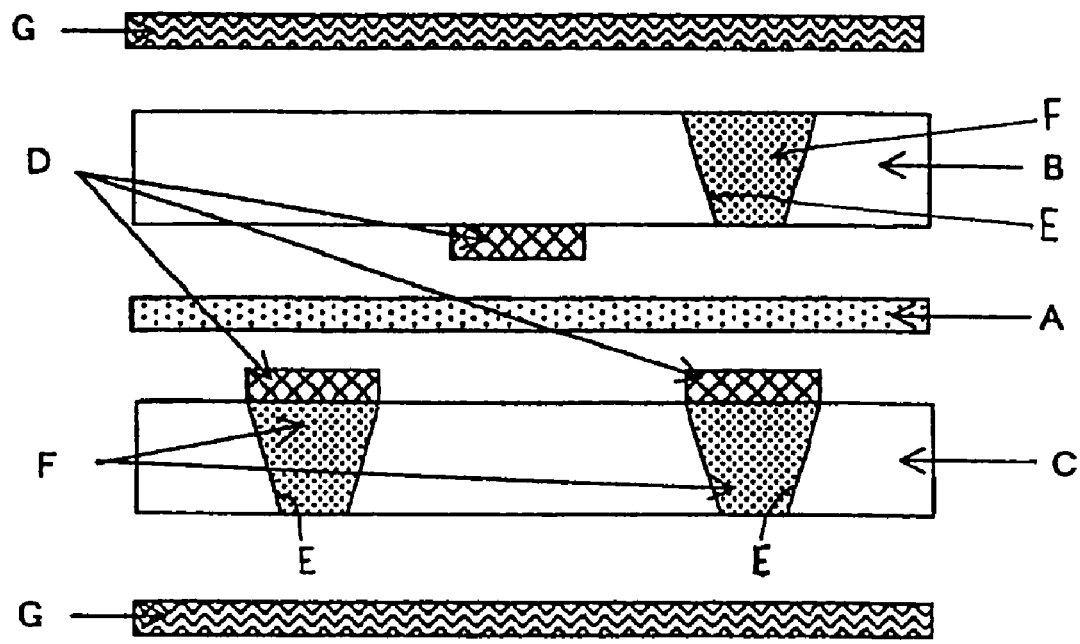

Specific examples of materials for each of first to third thermoplastic liquid crystal polymer films A, B and C that can be employed in the practice of the present invention include, although not specifically limited thereto, known thermotropic liquid crystal polyester and thermotropic liquid crystal polyester amide prepared from such compounds as classified under (1) to (4) below, and their derivatives.

(1) Aromatic or aliphatic dihydroxy compounds, representative examples of which are shown in Table 1 below.

TABLE 1

Chemical formulas of the representative examples of aromatic or aliphatic dihydroxy compounds

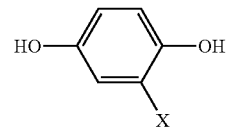

(X: hydrogen atom or halogen atom, or lower alkyl, phenyl or like groups)

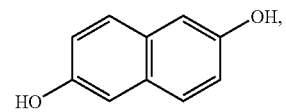

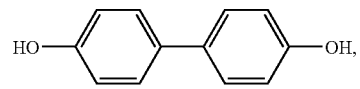

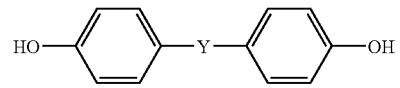

(Y: —O—, —CH$_2$—, —S— or the like groups)

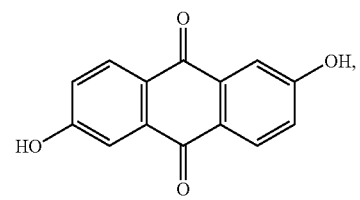

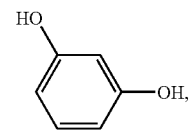

HO(CH$_2$)$_n$OH
(n: an integer from 2 to 12)

(2) Aromatic or aliphatic dicarboxylic acids, representative examples of which are shown in Table 2 below.

TABLE 2

Chemical formulas of the representative examples of aromatic or aliphatic dicarboxylic acids

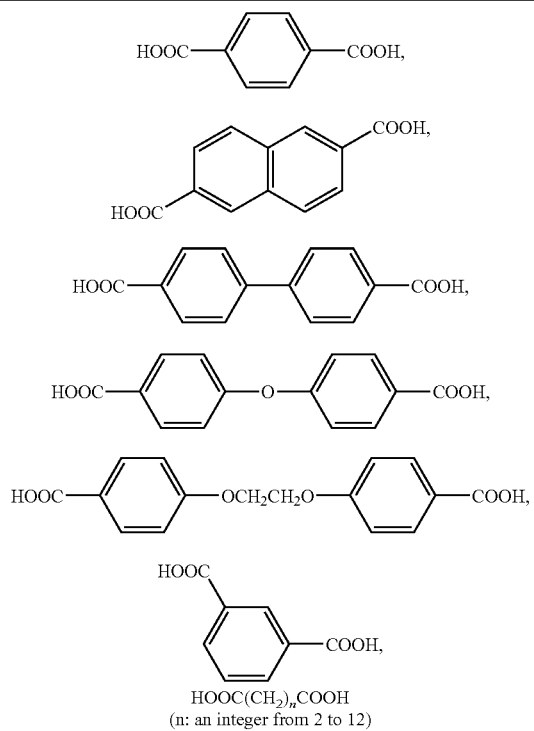

HOOC(CH$_2$)$_n$COOH
(n: an integer from 2 to 12)

(3) Aromatic hydroxycarboxylic acids, representative examples of which are shown in Table 3 below.

TABLE 3

Chemical formulas of the representative examples of aromatic hydroxycarboxylic acids

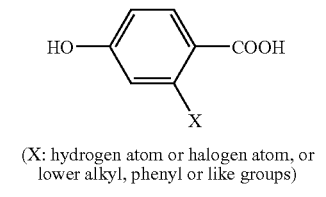

(X: hydrogen atom or halogen atom, or lower alkyl, phenyl or like groups)

TABLE 3-continued

Chemical formulas of the representative examples of aromatic hydroxycarboxylic acids

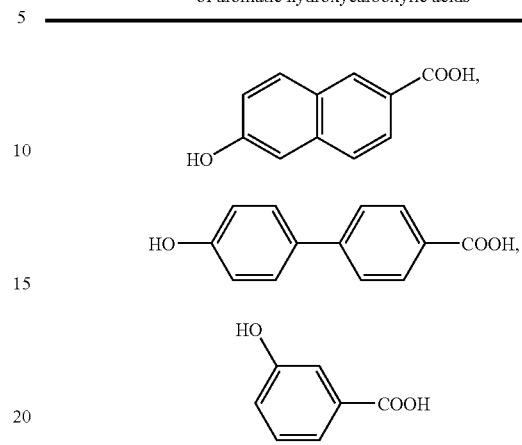

(4) Aromatic diamines, aromatic hydroxyamines and aromatic aminocarboxylic acids, representative examples of which are shown in Table 4 below.

TABLE 4

Chemical formulas of representative examples aromatic diamines, aromatic hydroxyamines and aromatic aminocarboxylic acids

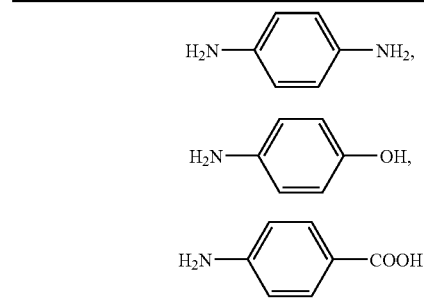

Representative examples of the thermoplastic liquid crystal polymers prepared from any of those starting compounds include copolymers having such structural units as indicated by (a) to (e) in Table 5 below.

TABLE 5

Structural units of the representative examples of thermoplastic liquid crystal polymers

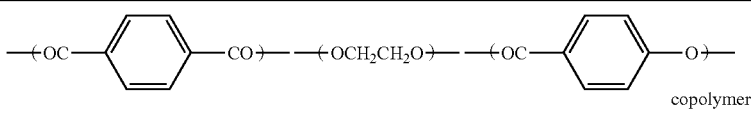

(a)

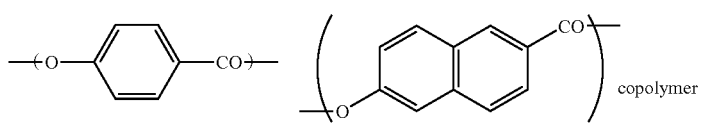

(b)

TABLE 5-continued

Structural units of the representative examples of thermoplastic liquid crystal polymers

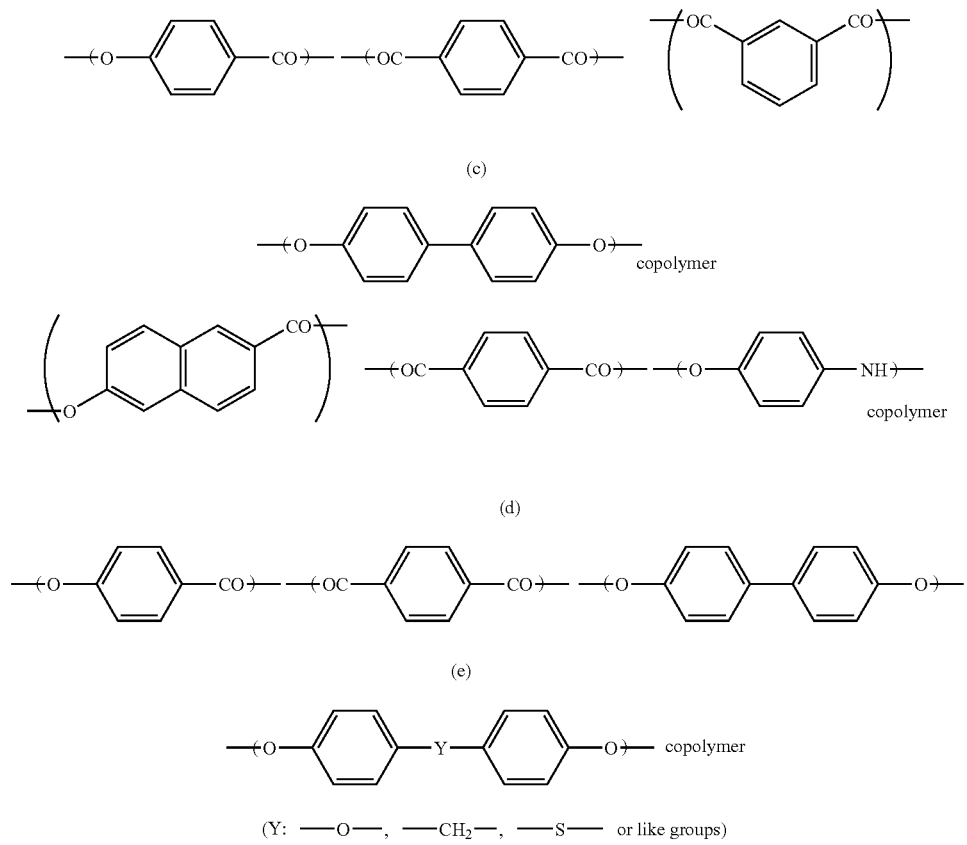

Those thermoplastic liquid crystal polymers have a melting point, which is a transition temperature to an optically anisotropic melt phase, preferably within the range of about 200 to about 400° C. and, more preferably, within the range of about 250 to about 350° C., so that the resulting film can have a desirable heat resistance and a desirable processability.

Unless the effect of the present invention is impaired, one or a mixture of various additives such as a lubricant, an antioxidant and a filler may be added thereto if desired.

In the practice of the present invention, the thermoplastic liquid crystal polymer films which serve as a printed wiring board together with a circuit pattern formed thereon, that is, the thermoplastic liquid crystal polymer films B and C, should be a film having a high melting point while the thermoplastic liquid crystal polymer film which serves as a bonding layer interposed between the printed wiring boards, that is, the thermoplastic liquid crystal polymer film A, should be a film having a lower melting point than those of the films B and C.

The respective melting points $Tm_2B$ and $Tm_2C$ of the thermoplastic liquid crystal polymer films B and C should be higher than the melting point $Tm_1$ of the thermoplastic liquid crystal polymer film A. The difference between the melting point of each of the thermoplastic liquid crystal polymer films B and C and that of the thermoplastic liquid crystal polymer film A (i.e., $Tm_2B-Tm_1$ and $Tm_2C-Tm_1$) is preferably not less than 10° C. and, more preferably, not less than 15° C.

The thermoplastic liquid crystal polymer film A preferably has a thickness so chosen as to be substantially equal to the height of a circuit pattern which, after having been laminated together with the thermoplastic liquid crystal polymer films B and C, penetrates such thermoplastic liquid crystal polymer film A. For this purpose, it is preferred that the thickness of the thermoplastic liquid crystal polymer film A, before being laminated together with the thermoplastic liquid crystal polymer films B and C, is preferably within the range of 1/5 to 1.5 times and, more preferably, within the range of 1/2 to 1.2 times the height of the circuit pattern that is formed on one of the thermoplastic liquid crystal polymer films B and C and penetrates the thermoplastic liquid crystal polymer film A.

The thermoplastic liquid crystal polymer films B and C are laminated together with the thermoplastic liquid crystal polymer film A interposed therebetween, by the thermo compression bonding at a temperature lower than the respective melting points $Tm_2B$ and $Tm_2C$ of the thermoplastic liquid crystal polymer films B and C, and higher than the melting point $Tm_1$ of the thermoplastic liquid crystal polymer film A. During the thermo compression bonding, the thermoplastic liquid crystal polymer film B and C will not be plasticized and, therefore, an undesirable displacement in position of the circuit patterns formed respectively on those thermoplastic liquid crystal polymer films B and C can advantageously be avoided.

Also, since the thickness of the thermoplastic liquid crystal polymer film A is so chosen as to be, after the lamination, substantially equal to the height of the circuit pattern which will penetrate such thermoplastic liquid crystal polymer film A, the circuit pattern can penetrate the thermoplastic liquid crystal polymer film A, which is molten, by the thermo compression bonding, to be plasticized enough, and make contact with the respective opposing surfaces of the thermoplastic polymer films B or C to realize the electric connection and physical bonding between the thermoplastic liquid crystal polymer films B and C, both of which are served as printed wiring boards.

It is also to be noted that the thermoplastic liquid crystal polymer film A, plasticized by the heat of the thermo compression bonding, can fill up air gaps found around the circuit patterns to give a multi-layer circuit board having a favorable insulating property.

The thermoplastic liquid crystal polymer films B and C have respective thermal deformation temperatures $Td_2B$ and $Td_2C$ preferably higher than the thermal deformation temperature $Td_1$ of the thermoplastic liquid crystal polymer film A by 20° C. or more, which can suppress the plastic deformation of the thermoplastic liquid crystal polymer films B and C during the thermo compression bonding to avoid any undesirable displacement in position of the circuit patterns formed respectively on those thermoplastic liquid crystal polymer films B and C.

It is to be noted that, if desired, both the melting point and the thermal deformation temperature of each of the thermoplastic liquid crystal polymer films can be increased to a desired value by subjecting the respective thermoplastic liquid crystal polymer film to a heat treatment. By way of example, conditions of the heat treatment may be such that even though the thermoplastic liquid crystal polymer film has a melting point of 283° C. and a thermal deformation temperature of 260° C., heating of such thermoplastic liquid crystal polymer film for 5 hours at 260° C. will result in the increase of the melting point and the thermal deformation temperature up to 320° C. and 310° C., respectively.

The thermoplastic liquid crystal polymer films employed in the practice of the present invention can be made by the use of known extrusion molding technique. Among them, the T-die process and the inflation process are industrially advantageous. Particularly with the inflation method, stresses caused by drawing can be applied not only in a direction of the mechanical axis of the film (which direction is hereinafter referred to as the "MD direction"), but also in a direction perpendicular to the MD direction (hereinafter referred to as "TD direction"). Therefore, the inflation method is effective, and is thus advantageously employed, to manufacture the thermoplastic liquid crystal polymer film having well balanced physical and thermal properties in both of the MD and TD directions. Also, the thermoplastic liquid crystal polymer films employed in the practice of the present invention are preferably substantially isotropic in their physical and thermal properties in both of the MD and TD directions, so that the multi-layer circuit board almost free from warping can be obtained.

Each of the thermoplastic liquid crystal polymer films employed in the practice of the present invention has a suitable segment orientation ratio (SOR) which may vary depending on the field of application thereof. If SOR is not less than 1.5, the deviation of the molecular orientation of the thermoplastic liquid crystal polymer is considerable, so that the thermoplastic liquid crystal polymer film would be stiff and be likely to be torn in the MD direction. Where the multi-layer circuit board is required to have a shape stability such as absence of warping during the heating, SOR of the thermoplastic liquid crystal polymer film constituting the multi-layer circuit board is preferably not more than 1.3. In particular, the thermoplastic liquid crystal polymer film having SOR not more than 1.3 can exhibit well balanced physical and thermal properties in both of the MD and TD directions which makes the film more advantageous in the practical use. Also, in the case of a high precision multi-layer circuit board that is required to be substantially free from warping during the heating, SOR of the thermoplastic liquid crystal polymer film constituting the multi-layer circuit board is preferably not more than 1.03.

The segment orientation ratio, SOR, referred to above represents the degree of molecular orientation and is quite different from the conventional MOR (molecular orientation ratio) in that SOR represents a value in which the thickness of an object is taken into consideration. This SOR can be calculated in the following manner.

Using a commercially available microwave molecular orientation degree measuring apparatus including a microwave resonance waveguide, a thermoplastic liquid crystal polymer film is inserted into the microwave resonance waveguide so that the film surface thereof is perpendicular to the propagation direction of the microwaves, and the intensity of the electric field of the microwaves transmitted through the film (i.e., the microwave permeability) is measured. Based on this measurement, the m value (hereinafter referred to as an "index of refraction") is calculated by the following equation:

$$m=(Zo/z)\times[1-i\,max/io];$$

wherein Zo represents a device constant; z represents the average thickness of an object subjected to the measurement; í max represents the frequency at which the maximum microwave permeability can be obtained when the frequency of the microwave is varied; and ío represents the frequency at which the maximum microwave permeability can be obtained when the average thickness is zero, that is, when no object is present.

Then, the segment orientation ratio, SOR, is calculated by dividing $m_0$ by $m_{90}$ (i.e., $SOR=m_0/m_{90}$), wherein $m_0$ represents the m value attained when the angle of rotation of the object relative to the direction of oscillation of the microwaves is 0°, that is, when the direction of oscillation of the microwaves is aligned with the direction in which molecules of the object are most oriented and the minimum microwave permeability is exhibited, and $m_{90}$ represents the m value attained when the angle of rotation of the object relative to the direction of oscillation of the microwaves is 90°.

The thickness of the thermoplastic liquid crystal polymer film that can be used in the practice of the present invention is not specifically limited to a particular value, but, where it is used as any of the films B and C each serving as the printed wiring board together with a circuit pattern formed thereon in a multi-layer circuit board, the thickness is preferably not greater than 5 mm and, more preferably, within the range of 0.1 to 3 mm. On the other hand, where it is used in a flexible printed circuit board, the thickness of the thermoplastic liquid crystal polymer film is preferably not greater than 500 μm and, more preferably, within the range of 10 to 250 μm.

In the practice of the present invention, at least one of the thermoplastic liquid crystal polymer films B and C that serve as respective printed wiring boards has a circuit pattern. This circuit pattern can be formed in any known manner. For example, the circuit pattern may be formed by any of the following methods:

(a) A method in which the thermoplastic liquid crystal polymer film and a metallic sheet are thermo compressed together, followed by an etching to form the circuit pattern.

(b) A method in which an electroconductive layer is first formed on a surface of the thermoplastic liquid crystal polymer film by a gas phase plating such as a sputtering technique, an ion plating technique and a vapor deposition technique or a liquid phase plating, followed by the formulation of the circuit pattern.

Material for the metallic sheet that can be used in the practice of the method (a) discussed above includes a metal suitably used for electric connection, such as copper, gold, silver, nickel or aluminum. Among them, copper is most preferred. The metallic sheet referred to above has a thickness preferably within the range of 1 to 50 μm and, more preferably, within the range of 5 to 20 μm.

Material for the electroconductive layer that can be used in the practice of the method (b) discussed above includes one of the metals illustrated above. Among them, copper is most preferable. The thickness of the electroconductive layer referred to above, although not specifically limited to a specific value, is preferably within the range of 1 to 50 μm and, more preferably, within the range of 5 to 20 μm.

The circuit pattern formed on any one of the thermoplastic liquid crystal polymer films B and C has a thickness corresponding to the thickness of the metallic sheet or the electroconductive layer discussed above and which is preferably within the range of 1 to 50 μm and, more preferably, within the range of 5 to 20 μm.

One or both of the thermoplastic liquid crystal polymer films B and C may, if necessary, have one or a plurality of micro-vias to be filled up with an electroconductive material such as an electroconductive paste or solder in order to achieve an interior and/or external electric connection of the circuit pattern. A suitable method of making those micro-vias is well known in the art and includes a laser processing, in which a carbon dioxide laser, a YAG laser or an eximer laser is utilized, and a chemical etching in which an alkaline solution is utilized. Also, if desired, one or both of the thermoplastic liquid crystal polymer films B and C may have one or a plurality of through-holes. Those through-holes can be formed by a drilling method and any of the micro-vias forming methods discussed above.

To fill up the micro-vias and/or through-holes with the electroconductive material, any known method can be employed, examples of which include a copper pattern plating utilizing either an electroless plating technique and/or an electrolytic plating technique and filling with an electroconductive paste.

In the practice of the present invention, the multi-layer circuit board can be fabricated by subjecting the thermoplastic liquid crystal polymer films B and C having the circuit pattern, and the thermoplastic liquid crystal polymer film A, which is interposed between the thermoplastic liquid crystal polymer films B and C, to thermo compression bonding. At this time, at least one of the respective circuit patterns formed on the thermoplastic liquid crystal polymer films B and C is arranged so as to penetrate the thermoplastic liquid crystal polymer film A.

The thermo compression bonding referred to above may be carried out by the use of any known means such as heating rolls, a heat-press of a flat bed type, a vacuum heat-press of a flat bed type, or a double-belted press. This thermo compression bonding may be carried out either continuously or in a batch manner.

The thermo compression bonding is preferably carried out at a temperature such that the thermoplastic liquid crystal polymer film A is sufficiently plasticized, but the thermoplastic liquid crystal polymer films B and C are not plasticized. Specifically, the temperature Tp (° C.) at which the thermo compression bonding is carried out preferably meets the following conditions (1) and (2) and, more preferably, the following conditions (3) and (4):

$$Tm_1 \leq Tp \tag{1}$$

$$Tp < Tm_2B \text{ and } Tp < Tm_2C \tag{2}$$

$$Tm_1 + 5 \leq Tp \tag{3}$$

$$Tp < Tm_2B - 10 \text{ and } Tp < Tm_2C - 10 \tag{4}$$

Also, in addition to the above discussed conditions, the temperature Tp also satisfies preferably the following condition (5) and, more preferably, the following condition (6):

$$Tp < Td_2B \text{ and } Tp < Td_2C \tag{5}$$

$$Tp < Td_2B - 10 \text{ and } Tp < Td_2C - 10 \tag{6}$$

The thermo compression bonding is carried out under a pressure generally within the range of 1 to 10 MPa, preferably within the range of 2 to 6 MPa and, more preferably, within the range of 3 to 5 MPa.

Hereinafter, preferred embodiments of the present invention will be described in details with reference to the accompanying drawings.

Referring now to FIG. 1, there is schematically shown a method of making a multi-layer circuit board according to a first preferred embodiment of the present invention. Specifically, FIG. 1A illustrates the arrangement of the components which constitute the multi-layer circuit board before the thermo compression bonding. As shown therein, one thermoplastic liquid crystal polymer film A and two thermoplastic liquid crystal polymer films B and C are employed. The thermoplastic liquid crystal polymer film B has a circuit pattern D and a micro-via E while the thermoplastic liquid crystal polymer film C has two circuit patterns D and two micro-vias E. An electroconductive material F such as an electroconductive paste or a solder is filled in each of the micro-vias E, so that the external electric connection of the circuit patterns D formed on the thermoplastic liquid crystal polymer film C may be achieved after the thermo compression bonding of those films B and C together with the film A interposed therebetween. The film A has a thickness so chosen as to become substantially equal to the height of the circuit patterns D after the thermo compressing bonding.

The thermo compression bonding is carried out in the following manner. While the films B and C are positioned in face-to-face relation with each other with the circuit pattern D in the film B opposing the circuit patterns D in the film C, the film A is interposed between those films B and C. Metallic sheets G and G are then arranged externally of the stack of those films A to C, and the resulting assembly is heated in its entirety to a temperature lower than the melting point of the thermoplastic liquid crystal polymer films B and C, and higher than the melting point of the thermoplastic liquid crystal polymer film A to perform the thermo compression bonding.

Figure 1B:
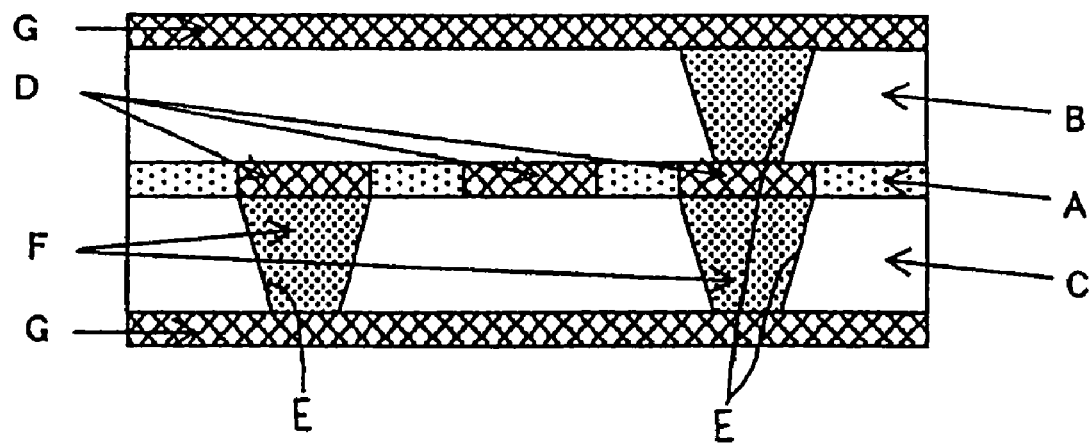

FIG. 1B illustrates the multi-layer circuit board after the thermoplastic liquid crystal polymer films A to C have been thermo compressed together. As shown therein, after the thermo compression bonding, the circuit patterns D extend completely across the thermoplastic liquid crystal polymer film A to be held in contact with the opposing surface of the thermoplastic liquid crystal polymer films B and C. At the same time, air-gap left by and around the circuit patterns D in each of the thermoplastic liquid crystal polymer films B and C is filled up by the thermoplastic liquid crystal polymer film A.

In the multi-layer circuit board so fabricated, the metallic sheets G positioned on respective outer surfaces of the multi-layer circuit board may be subjected to an etching to form circuit patterns which are electrically connected with the intra-layer circuit patterns D by means of an electroconductive material F within the micro-vias E.

The films B and C may have the same melting point. Alternatively, the films B and C may have respective melting points different from each other, provided that they are higher than the melting point of the film A. Also, in FIG. 1, one or both of the metallic sheets G may be omitted in the practice of the present invention.

It is to be noted that, although not shown, the present invention does not exclude an embodiment which further comprises a formation, by means of a laser processing, drilling or chemical etching, of one or more through-holes extending completely through the multi-layer circuit board in order to establish an electric connection throughout all printed circuit boards.

Figure 2A:
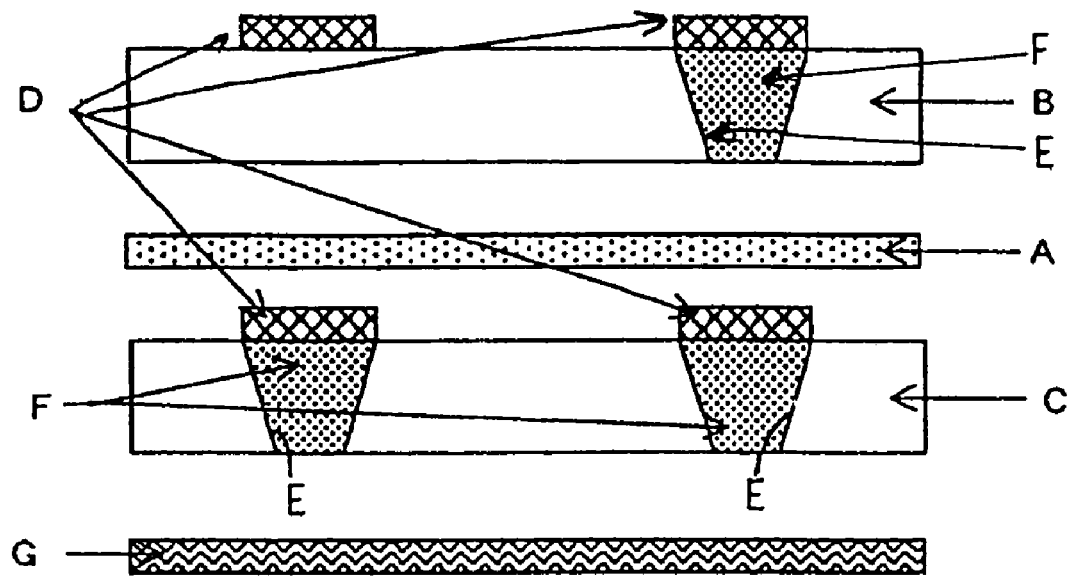

FIG. 2 illustrates the method of making the multi-layer circuit board according to a second preferred embodiment of the present invention, wherein FIG. 2A illustrates the arrangement of the components which constitute the multi-layer circuit board before the thermo compression bonding. As shown therein, each of the thermoplastic liquid crystal polymer films B and C has the circuit patterns D formed on the upper surface thereof. The lower surface of the thermoplastic liquid crystal polymer film B is opposed to the upper surface of the thermoplastic liquid crystal polymer film C with the thermoplastic liquid crystal polymer film A interposed therebetween. The stack of those thermoplastic liquid crystal polymer films A to C arranged as discussed above are thermo compressed together to give the multi-layer circuit board.

Figure 2B:
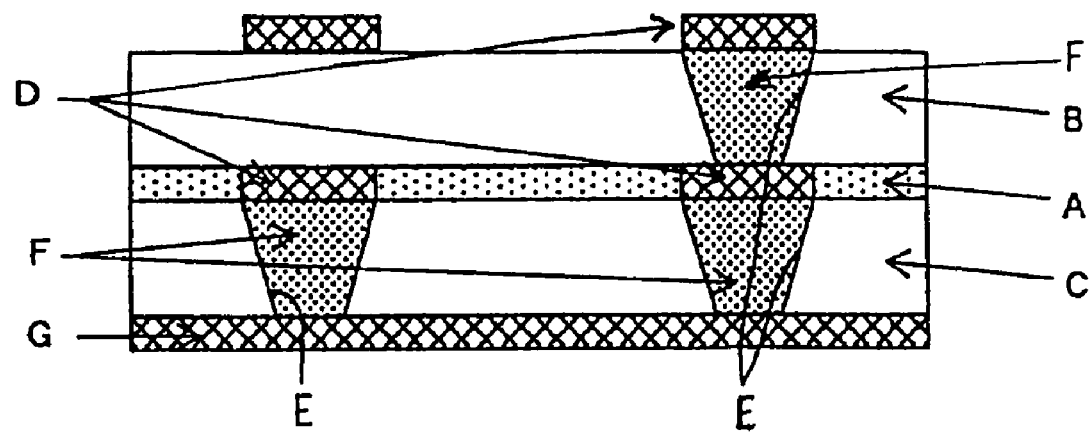

FIG. 2B illustrates the multi-layer circuit board after the thermo compression bonding. It will readily be seen that the circuit patterns D formed on the thermoplastic liquid crystal polymer film C extend across the film A to be held in contact with the lower surface of the thermoplastic liquid crystal polymer film B.

Other structural features of the multi-layer circuit board shown in FIGS. 2A and 2B are similar to those of the multi-layer circuit board shown in FIGS. 1A and 1B and, therefore, the details thereof are not mentioned for the sake of brevity. Parts shown in FIGS. 2A and 2B, which correspond to those shown in FIGS. 1A and 1B are designated by the same reference numerals. It is to be noted that in FIGS. 2A and 2B, the metallic sheet G positioned adjacent to the film B in FIGS. 1A and 1B is not employed.

Figure 3A:
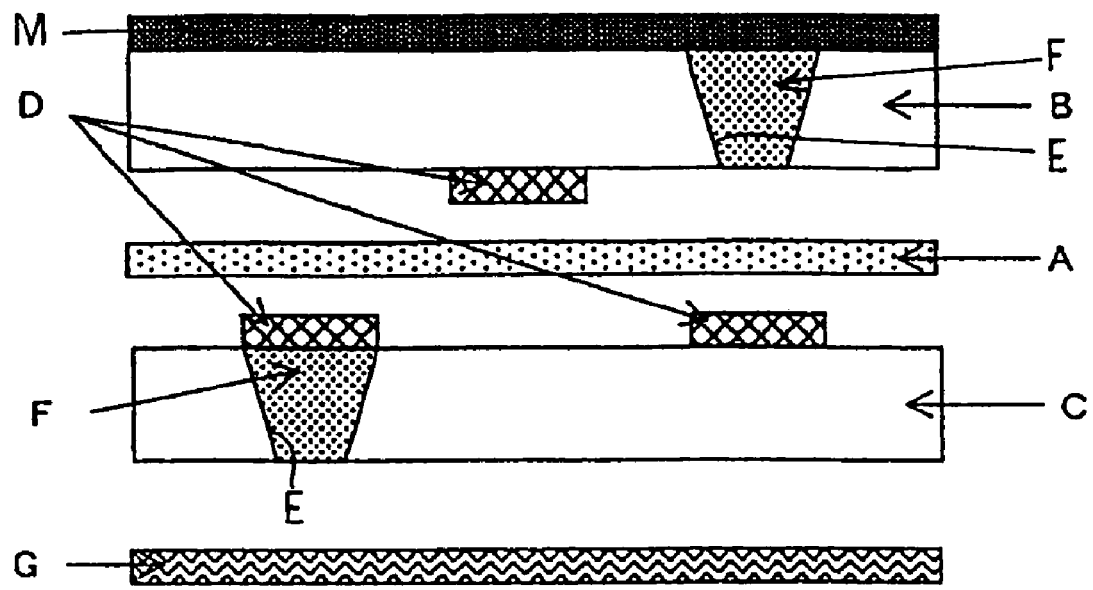
Figure 3B:
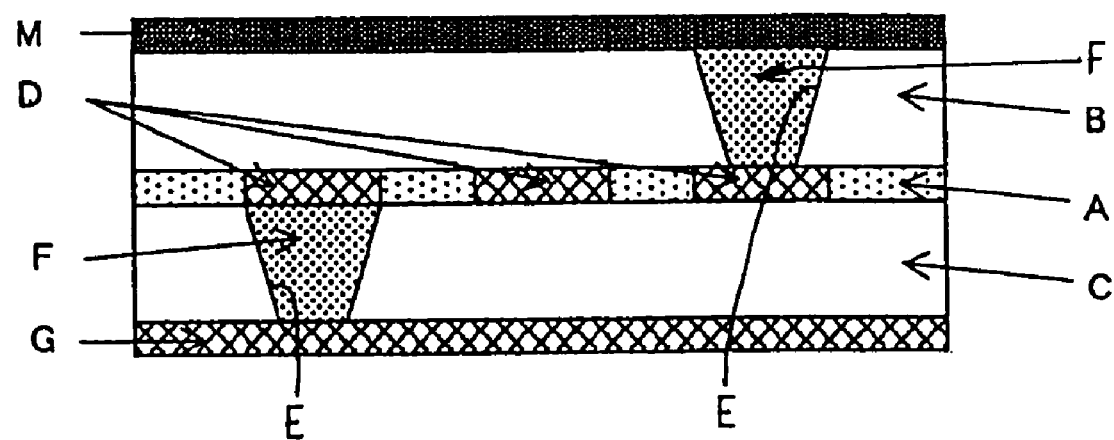

FIG. 3 illustrates the method of making the multi-layer circuit board according to a third preferred embodiment of the present invention, wherein FIG. 3A illustrates the arrangement of the components which constitute the multi-layer circuit board before the thermo compression bonding. As shown therein, the thermoplastic liquid crystal polymer film B has its upper surface formed with a metallic layer M and its lower surface formed with the circuit pattern D, whereas the thermoplastic liquid crystal polymer film C has its upper surface formed with the circuit patterns D. The upper surface of the thermoplastic liquid crystal polymer film C is opposed to the lower surface of the thermoplastic liquid crystal polymer film B with the thermoplastic liquid crystal polymer film A interposed therebetween. The stack of those thermoplastic liquid crystal polymer films A to C arranged as discussed above are thermo compressed together to give the multi-layer circuit board. FIG. 3B illustrates the multi-layer circuit board after the thermo compression bonding.

Other structural features of the multi-layer circuit board shown in FIGS. 3A and 3B are similar to those of the multi-layer circuit board shown in FIGS. 1A and 1B and, therefore, the details thereof are not mentioned for the sake of brevity. Parts shown in FIGS. 3A and 3B, which correspond to those shown in FIGS. 1A and 1B are designated by the same reference numerals.

Figure 4A:
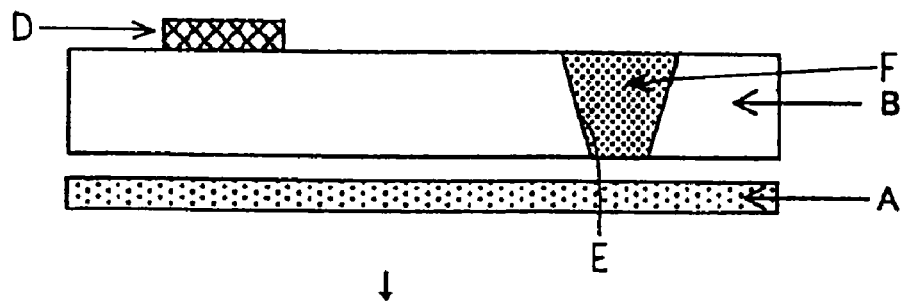
FIGS. 4A to 4C illustrate the sequence of making the multi-layer circuit board according to a fourth preferred embodiment of the present invention.
Figure 4B:
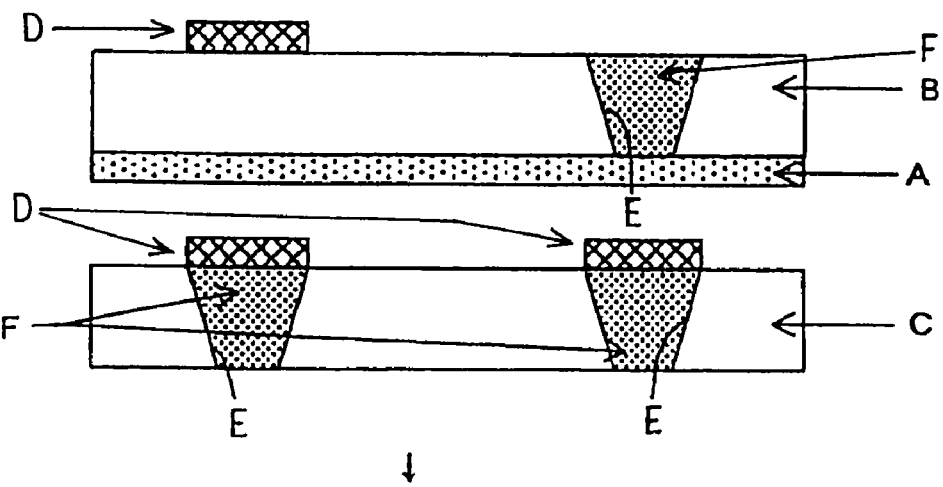
Figure 4C:
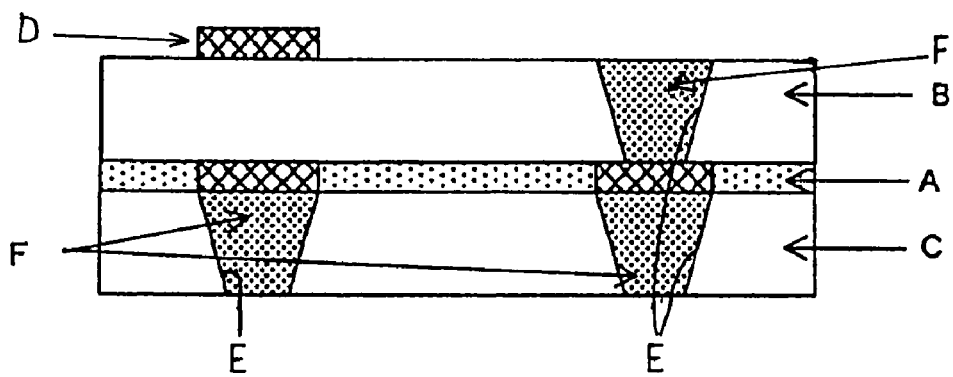
Figure 5A:
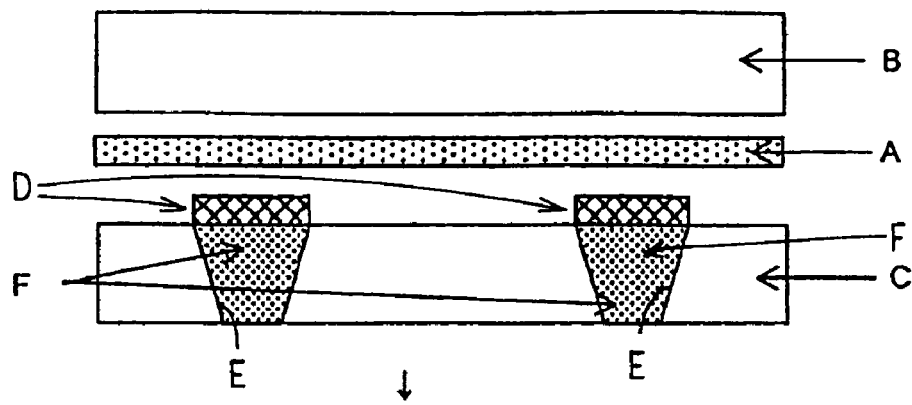
FIGS. 5A to 5D illustrate the sequence of making the multi-layer circuit board according to a fifth preferred embodiment of the present invention.
Figure 5B:
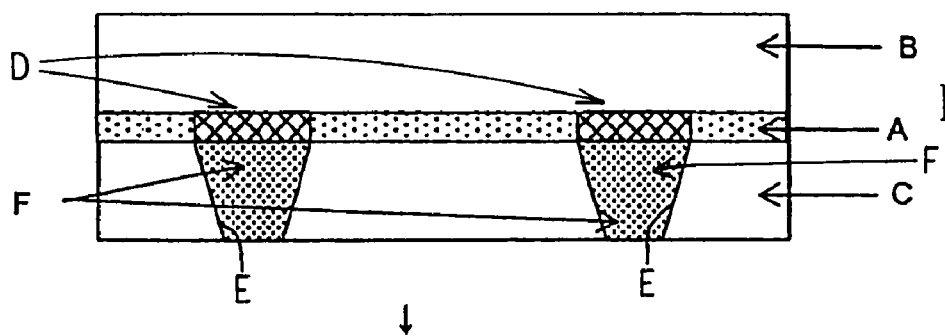
Figure 5C:
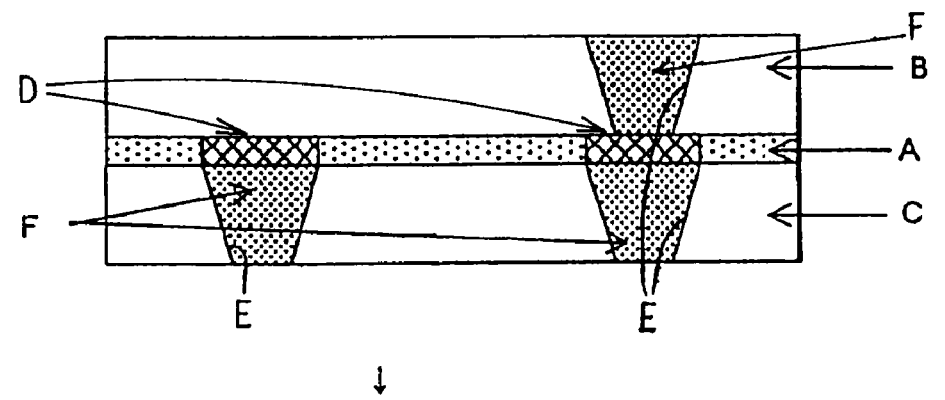
Figure 5D:
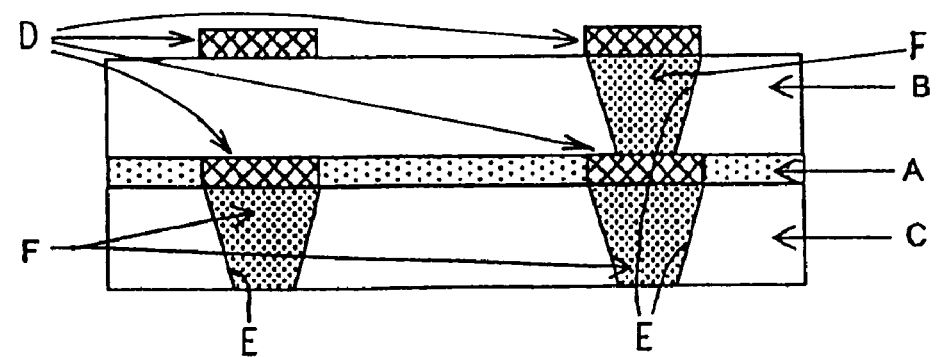

FIG. 4 illustrates the method of making the multi-layer circuit board according to a fourth preferred embodiment of the present invention. In this embodiment, the thermoplastic liquid crystal polymer film B formed with the circuit pattern D on its upper surface is first thermo compressed together with the thermoplastic liquid crystal polymer film A to form a first laminate as shown in FIG. 4A. Then, the first laminate so formed is thermo compressed to the thermoplastic liquid crystal polymer film C having the circuit patterns D as shown in FIG. 4B to give the multi-layer circuit board as shown in FIG. 4C.

In this case, the circuit patterns D formed in the thermoplastic liquid crystal polymer film C extend completely across the thermoplastic liquid crystal polymer film A to be held in contact with the surface of the thermoplastic liquid crystal polymer film B. It is to be noted that in FIGS. 4A to 4C, both of the metallic sheets G positioned adjacent to the films B and C in FIGS. 1A and 1B are not employed.

Other structural features of the multi-layer circuit board shown in FIGS. 4A to 4C are similar to those of the multi-layer circuit board shown in FIGS. 1A and 1B and, therefore, the details thereof are not mentioned for the sake of brevity. Parts shown in FIGS. 4A to 4C, which correspond to those shown in FIGS. 1A and 1B are designated by the same reference numerals.

FIG. 5 illustrates the method of making the multi-layer circuit board according to a fifth preferred embodiment of the present invention. In this embodiment, the thermoplastic liquid crystal polymer film B having no circuit pattern and the thermoplastic liquid crystal polymer film C having the circuit patterns D and micro-vias E, filled with an electroconductive material F, as shown in FIG. 5A, are thermo compressed with the thermoplastic liquid crystal polymer film A interposed therebetween to give a laminate of a structure shown in FIG. 5B. Thereafter, at least one micro-via E is formed in the layer of the thermoplastic liquid crystal polymer film B as shown in FIG. 5C, followed by filling of an electroconductive material F. Then, circuit patterns D are formed on the upper surface of the layer of the thermoplastic liquid crystal polymer film B to give the multi-layer circuit board as shown in FIG. 5D.

It is also to be noted that in FIGS. 5A to 5D, both of the metallic sheets G as positioned adjacent to the film B and C in FIGS. 1A and 1B are not employed.

Other structural features of the multi-layer circuit board shown in FIGS. 5A to 5D are similar to those of the multi-layer circuit board shown in FIGS. 1A and 1B and, therefore, the details thereof are not mentioned for the sake of brevity. Parts shown in FIGS. 5A to 5D, which correspond to those shown in FIGS. 1A and 1B are designated by the same reference numerals.

Figure 6:
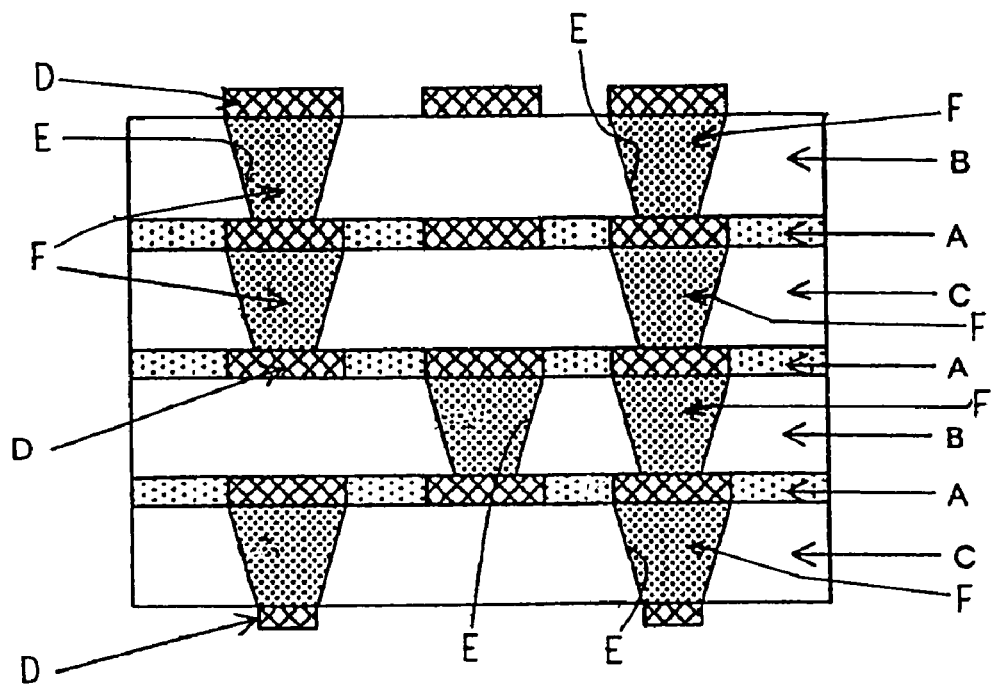
FIG. 6 is a schematic vertical sectional view of the multi-layer circuit board according to a sixth preferred embodiment of the present invention.

FIG. 6 illustrates the multi-layer circuit board manufactured by the method according to a sixth preferred embodiment of the present invention. In this multi-layer circuit board, pluralities of thermoplastic liquid crystal polymer films B and C (printed wiring boards) having circuit patterns D and a corresponding number of thermoplastic liquid crystal polymer films A are employed. The assembly of those films A to C are thermo compressed together with each thermoplastic liquid crystal polymer film A interposed between the neighboring thermoplastic liquid crystal polymer films B and C. As a matter of course, the printed wiring boards are electrically connected with each other through the electroconductive materials F within the micro-vias E formed in the thermoplastic liquid crystal polymer films B and C.

Figure 7:
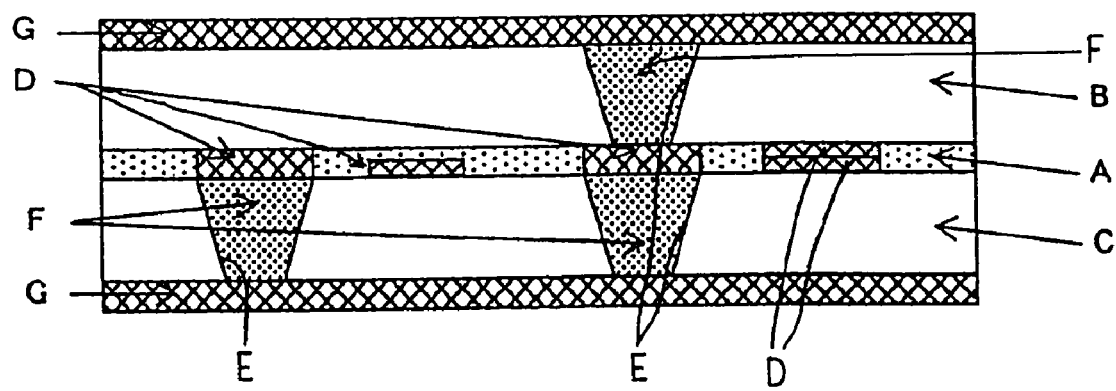
FIG. 7 is a schematic vertical sectional view of the multi-layer circuit board according to a seventh preferred embodiment of the present invention.

FIG. 7 illustrates the multi-layer circuit board manufactured by the method according to a seventh preferred embodiment of the present invention. In this embodiment, the circuit patterns D have varying heights, and only the circuit pattern D having the greatest height extends completely through the thermoplastic liquid crystal polymer film A. The other circuit patterns D having a smaller height are embedded within the thermoplastic liquid crystal polymer film A as clearly shown therein. It is to be noted that, as shown at the right most portion therein, the circuit patterns D formed in the thermoplastic liquid crystal polymer films B and C may be held in contact directly with each other.

Other structural features of the multi-layer circuit board shown in FIG. 7 are similar to those of the multi-layer circuit board shown in FIG. 1B and, therefore, the details thereof are not mentioned for the sake of brevity. Parts shown in FIG. 7, which correspond to those shown in FIG. 1B are designated by the same reference numerals.

Figure 8:
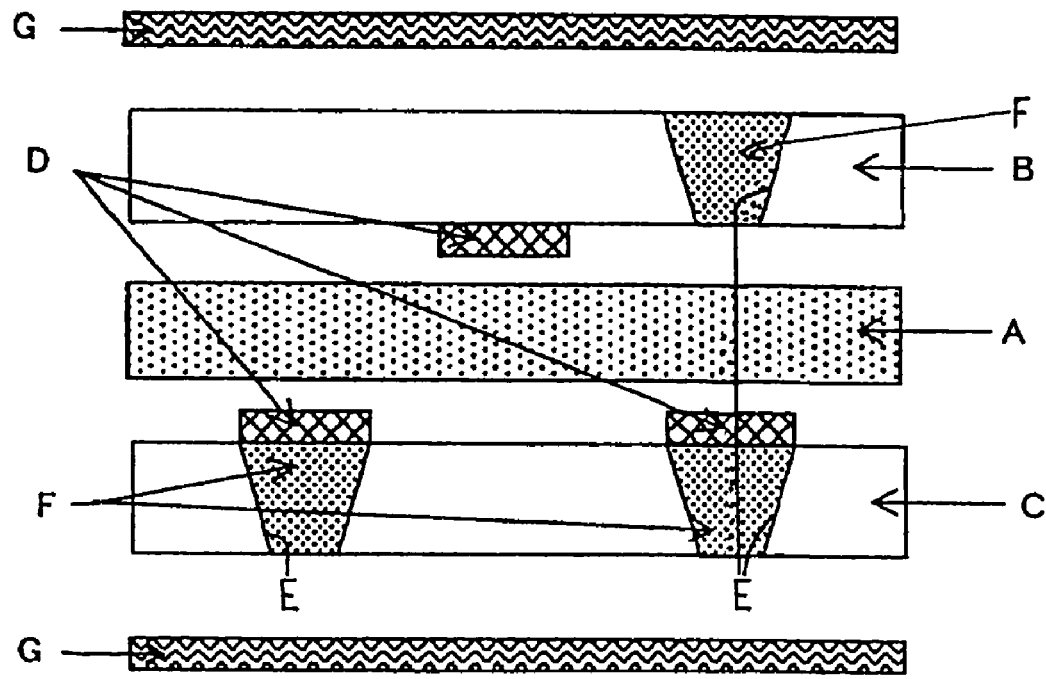
FIG. 8 is a vertical sectional view showing the conventional method of making a multi-layer circuit board.

The multi-layer circuit board manufactured by the known method such as disclosed in, for example, the previously discussed the U.S. Pat. No. 5,719,354 and the Japanese Patent Application Laid-open No. Hei 11-309803 is shown in FIG. 8. In the practice of this known manufacturing method, the thermoplastic liquid crystal polymer films B and C having the respective circuit patterns D are first positioned with the circuit pattern on the film B opposing the circuit patterns D on the film C, while the thermoplastic liquid crystal polymer film A is interposed therebetween. The stack of those films A to C so positioned are thermo compressed together.

Figure 9:
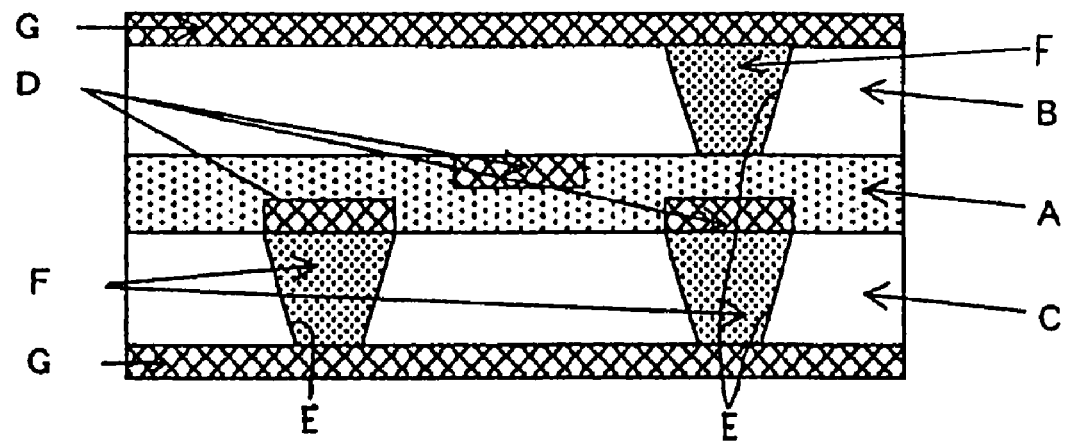
FIG. 9 is a schematic vertical sectional view of the multi-layer circuit board manufactured by the method shown in FIG. 8.

In this multi-layer circuit board, since the thermoplastic liquid crystal polymer layer A has a large thickness, none of the circuit patterns D penetrate the thermoplastic liquid crystal polymer film A and, instead, they are embedded within the thermoplastic liquid crystal polymer film A as shown in FIG. 9. Accordingly, the thermoplastic liquid crystal polymer films B and C having the respective circuit patterns D are electrically insulated from each other.

Hereinafter, the present invention will be demonstrated by way of specific examples which are not intended to limit the scope of the present invention, but are shown only for the purpose of illustration.

It is to be noted that in all of those specific examples, physical properties of the thermoplastic liquid crystal polymer films, including the melting point, thermal deformation temperature and film thickness, and physical properties of the multi-layer circuit board, including micro-via misalignment, bonding strength and electroconductivity, were evaluated in the following manner.

(1) Melting Point:

Using a differential scanning calorimeter, the thermal behavior of the film is observed for measurement of the melting point. In other words, after the temperature of the test film is raised at a rate of 20° C./min to completely melt the film, the molten product is rapidly cooled to 50° C. at a rate of 50° C./min and then the peak temperature of the endothermic curve appearing when the temperature thereof is raised again at a rate of 20° C./min is recorded as the melting point of the film.

(2) Thermal Deformation Temperature:

The graph (thermal deformation curve) representing the relation of temperature versus thermal deformation of the thermoplastic liquid crystal polymer film when heated is plotted by a thermomechanical analyzer ("TMA-50" made by Shimadzu Corporation), and the thermal deformation temperature is defined by the temperature appearing at the point of intersection between approximated linear lines passing respectively through a thermal deformation curve on a high temperature region and a thermal deformation curve on a low temperature region.

(3) Film Thickness:

Using a digital thickness meter (made by Mitsutoyo Corporation), the thermoplastic liquid crystal polymer film is measured at intervals of 1 cm in the TD direction, and the film thickness is represented by the average value of arbitrarily chosen 10 film thicknesses.

Figure 10A:
FIGS. 10A to 10D are schematic vertical sectional views showing respective structures of the product obtained at the process steps in the method of making the multi-layer circuit board according to the present invention illustrated as the Example 1.
Figure 10B:
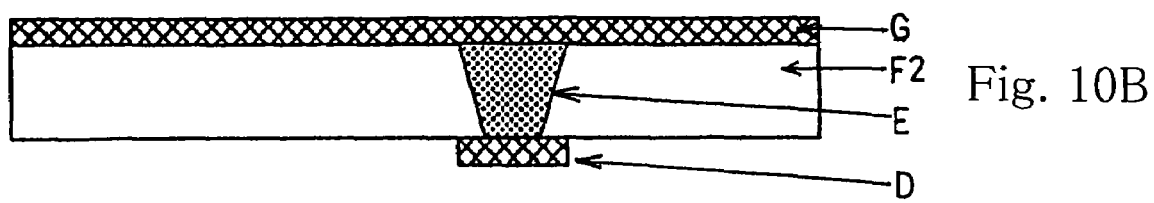
Figure 10C:
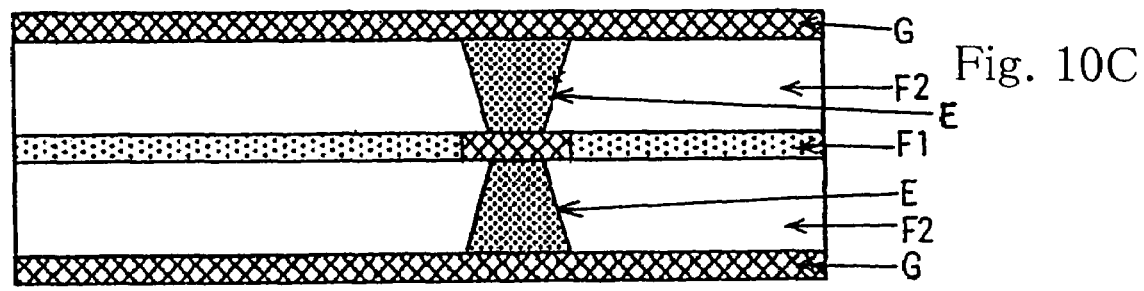
Figure 10D:
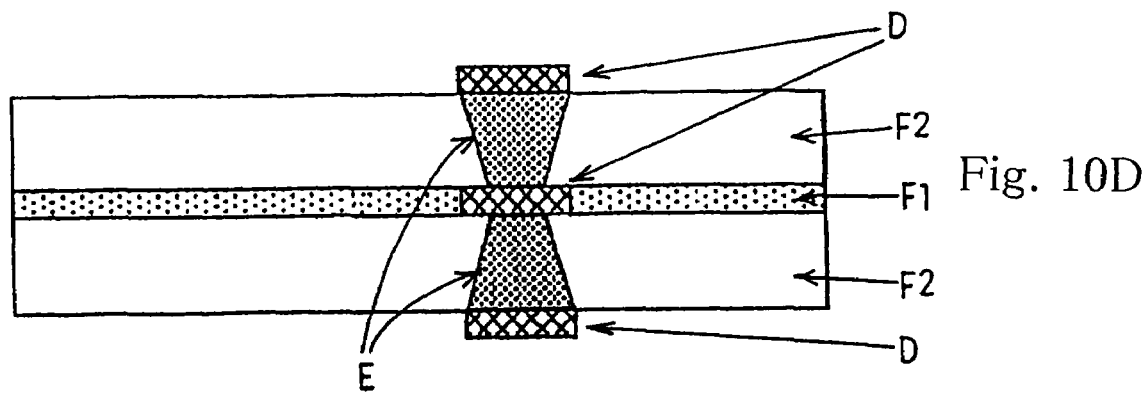

(4) Micro-Via Misalignment:

The vertical sectional observation of the multi-layer circuit board by scanning electron microscopy is carried out to determine the horizontal distance L between, as shown in FIG. 10D, the center position of the micro-via in the bottom circular plane thereof, having a radius of R, in the second film and the center position of the micro-via in the upper circular plane thereof, having a radius of R, in the third film. The amount of misalignment is calculated by the following equation:

Micro-via Misalignment(%)=$L/R \times 100$;

wherein R means designed radius of the micro-via.

(5) Bonding Strength:

A test piece of a width of 1 cm is cut out from the region of the multi-layer circuit board where no circuit pattern is formed and is then fixed on a flat plate with the outermost layer thereof bonded to the plate by a double-sided adhesive tape. By the 180° peel strength test method in accordance with JIS C 5016, the peel strength when the opposite outermost layer of the laminate is peeled off at a rate of 50 mm per minute is determined.

(6) Electroconductivity:

In order to establish an electroconductivity through all of the layers forming the multi-layer circuit board, the electric resistance R1 between the outermost circuit patterns, which are electrically connected with the intra-layer wiring through micro-vias, is measured through electrodes connected to both of the opposite outermost circuit patterns of the multi-layer circuit board. With R2 representing a designed electric resistance, the value of [R1/R2×100] is evaluated as an index (%) of the electroconductivity.

Referential Example 1

A thermoplastic liquid crystal polymer composed of a copolymer of p-hydroxybenzoic acid and 6-hydroxy-2-naphthoic acid and having a melting point of 283° C. was melt-extruded and then drawn by means of the inflation technique, wherein the draw ratio was 2.0 and the blow ratio was 6.0, to give a thermoplastic liquid crystal polymer film F1 of 20 μm in thickness and having a segment orientation ratio (SOR) of 1.03, a melting point of 283° C. and a thermal deformation temperature of 260° C.

Referential Example 2

A thermoplastic liquid crystal polymer composed of a copolymer of p-hydroxybenzoic acid and 6-hydroxy-2-naphthoic acid and having a melting point of 325° C. was melt-extruded and then drawn by means of the inflation technique, wherein the draw ratio was 2.0 and the blow ratio was 6.0, to give a thermoplastic liquid crystal polymer film F2 of 50 μm in thickness and having a segment orientation ratio (SOR) of 1.03, a melting point of 325° C. and a thermal deformation temperature of 305° C.

Example 1

The multi-layer circuit board was obtained by the following procedures 1 to 4, which are shown respectively as FIGS. 10A to 10D.

Procedure 1:

A micro-via of a designed diameter of 100 μm was formed in the thermoplastic liquid crystal polymer film F2, obtained by the Referential Example 2, at a predetermined portion by means of a carbon dioxide laser. Thereafter, the micro-via was filled with an electroconductive paste which was subsequently cured by a preliminary heating (FIG. 10A).

Procedure 2:

An electrolytic copper foil of 18 μm in thickness was applied on each of the opposite surfaces of the thermoplastic liquid crystal polymer film F2 having the micro-via obtained by the Procedure 1. Then the stack (copper foil/thermoplastic liquid crystal polymer film/copper foil) was thermo compressed together at a temperature of 335° C. under a pressure of 3 MPa by a vacuum heat-press, to give the double-sided copper clad laminate in which the electroconductive paste filled in the micro-via was completely cured. Thereafter, a predetermined portion of a first surface of the laminate and the entire area of a second surface, opposite to the first surface, of the laminate were covered by respective resist films. Using an aqueous ferric chloride as an etchant, a portion of the copper foil outside the resist film on the first surface of the laminate was etched, followed by the removal of the resist film to give a single-sided copper clad laminate 1 in which the micro-via is formed in the inner layer of the thermoplastic liquid crystal polymer film F2 and having a wiring pattern D on one surface thereof (FIG. 10B).

Also, a similar single-sided copper clad laminate 2 having no circuit pattern was prepared by following the Procedure 2, i.e., by preparing the double-sided copper clad laminate of a thermoplastic liquid crystal polymer film F2 and two electrolytic copper foils of 18 μm, having a similar micro-via therein, followed by etching to remove the copper foil from one of the outer surfaces of the double-sided copper clad laminate.

Procedure 3:

The single-sided copper clad laminates 1 and 2 obtained by the Procedure 2 were disposed on both side of the thermoplastic liquid crystal polymer film F1 obtained by the Referential Example 1 with the copper layers G on the respective single-sided copper clad laminates 1 and 2 oriented outwardly by the pin-lamination method so that the center positions of the micro-vias of the single-sided copper clad laminates 1 and 2 were opposed accurately. The assembly was thermo compressed together at a temperature of 288° C. under a pressure of 3 MPa by a vacuum heat-press, to give a laminate (FIG. 10C).

Procedure 4:

The copper foil on the outermost layer of the laminate obtained by the Procedure 3 was pattern-etched by the technique employed in the Procedure 2 to form the multi-layer circuit board having three electroconductive layers (FIG. 10D). This multi-layer circuit board is flat in shape. The results of evaluation thereof are shown in Table 6. As can readily be see from Table 6, the multi-layer circuit board so manufactured is indeed useful.

Comparative Example 1

Procedures 1 to 4 of the Example 1 were repeated except that, in the Procedure 3, instead of one thermoplastic liquid crystal polymer film F1, the two thermoplastic liquid crystal polymer films F1 were interposed between the single-sided copper clad laminates 1 and 2, to give a multi-layer circuit board. The resulting multi-layer circuit board was evaluated, results of which are shown in Table 6. As can readily be understood from Table 6, the multi-layer circuit board for this comparison purpose has exhibited a large micro-via misalignment and a low electroconductivity. Observation of the vertical cross-section of this multi-layer circuit board has shown that the micro-via and the wiring pattern fabricated under Procedure 2 were misaligned from each other and that a thin film of the thermoplastic liquid crystal polymer resulted from the film F1 remained between the wiring pattern and the micro-vias.

TABLE 6

|  | Micro-via Misalignment (%) | Bonding Strength (kgf/cm) | Electro-conductivity (%) |
|---|---|---|---|
| Example 1 | 0.3 | 1.1 | 99.2 |
| Comparative Example 1 | 38.6 | 1.1 | 15.7 |

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What we claim is:

1. A method of making a multi-layer circuit board,
said multi-layer circuit board comprising a first film and at least two more films, second and third films, each being made of a thermoplastic polymer capable of forming an optically anisotropic melt phase, the first film having a low melting point, the second and third films having respective melting points higher than the melting point of the first film and at least one of the second and the third films having a circuit pattern thereon, said first to third films being thermo compressed together with said first film interposed between the second and third films, wherein the circuit pattern having a height within the range of 1 to 50 μm and prior to the thermo compression bonding, the first film has a thickness within the range of ⅕ to 1.5 times a height of the circuit pattern which will penetrate the first film, said method comprising:
causing at least one of the circuit patterns on one of the second and third films to contact an opposing surface of the other of the second and third films through the first film during the thermo compression bonding of the first to third films by selecting the thickness of the first film depending on the height of the circuit pattern and then laminating the second and third films with the first film interposed there between by the thermo compression at a temperature higher than the melting point of the first film and lower than the melting points of the second and third films.

2. The method of making a multi-layer circuit board as claimed in claim 1, wherein each of the respective melting points of the second and third films is higher than the melting point of the first film by 15° C. or more.

3. The method of making a multi-layer circuit board as claimed in claim 1, wherein one or both of the second and third films have at least one micro-via.

4. The method of making a multi-layer circuit board as claimed in claim 1, wherein each of the second and third films has a thermal deformation temperature higher than that of the first film by 20° C. or more.

5. The method of making a multi-layer circuit board as claimed in claim 1, wherein each of the first to third films is substantially isotropic.

6. The method of making a multi-layer circuit board as claimed in claim 1, wherein the circuit pattern having a height within the range of 5 to 20 μm and prior to the thermo compression bonding, the first film has a thickness within the range of ½ to 1.2 times a height of the circuit pattern which will penetrate the first film.

7. The method of making a multi-layer circuit board as claimed in claim 1, wherein said first to third films are thermo compressed together with said first film interposed between the second and third films by a flat heat press.

8. The method of making a multi-layer circuit board as claimed in claim 7, wherein the flat heat press comprises heating rolls, a heat-press of a flat bed type, a vacuum heat-press of a flat bed type, or a double-belted press.

9. The method of making a multi-layer circuit board as claimed in claim 1, wherein said causing at least one of the circuit patterns on one of the second and third films to contact an opposing surface of the other of the second and third films through the first film during the thermo compression bonding of the first to third films by selecting the thickness of the first film depending on the height of the circuit pattern is without deforming the circuit pattern.

* * * * *